United States Patent [19]

Hutchins et al.

[11] Patent Number: 5,384,267

[45] Date of Patent: Jan. 24, 1995

[54] METHOD OF FORMING INFRARED DETECTOR BY HYDROGEN PLASMA ETCHING TO FORM REFRACTORY METAL INTERCONNECTS

[75] Inventors: Larry D. Hutchins, Richardson; Rudy L. York, Plano, both of Tex.

[73] Assignee: Texas Instruments Incorporated, Dallas, Tex.

[21] Appl. No.: 140,390

[22] Filed: Oct. 19, 1993

[51] Int. Cl.⁶ .................. H01L 31/18; H01L 21/44
[52] U.S. Cl. .......................................... 437/3; 437/5; 437/245; 437/937; 156/643; 156/646
[58] Field of Search ............. 437/3, 5, 54, 206, 245, 437/937; 156/643, 646

[56] References Cited

U.S. PATENT DOCUMENTS

| | | | |
|---|---|---|---|
| 3,962,578 | 6/1976 | Roschen | 250/226 |
| 4,085,500 | 4/1978 | Hager et al. | 29/589 |
| 4,143,269 | 3/1979 | McCormack et al. | 250/352 |
| 4,412,732 | 10/1983 | Wotherspoon | 156/643 |
| 4,447,291 | 5/1984 | Schulte | 156/643 |
| 4,614,957 | 9/1986 | Arch et al. | 357/16 |
| 4,639,756 | 1/1987 | Rosbeck et al. | 357/308 |
| 4,663,529 | 5/1987 | Jenner et al. | 250/338 |
| 4,684,812 | 8/1987 | Tew et al. | 250/578 |
| 4,948,976 | 8/1990 | Baliga et al. | 250/370 |
| 4,965,649 | 10/1990 | Zanio et al. | 357/30 |
| 5,047,644 | 9/1991 | Meissner et al. | 250/332 |
| 5,113,076 | 5/1992 | Schulte | 250/370 |
| 5,144,138 | 9/1992 | Kinch et al. | 250/332 |
| 5,188,970 | 2/1993 | York et al. | 437/3 |
| 5,236,871 | 8/1993 | Fossum et al. | 437/195 |
| 5,246,875 | 9/1993 | Shinji et al. | 437/53 |
| 5,273,910 | 12/1993 | Tran et al. | 437/3 |
| 5,318,666 | 6/1994 | Eklind et al. | 156/643 |

FOREIGN PATENT DOCUMENTS

0090669 10/1983 European Pat. Off. ..... H01L 31/08

OTHER PUBLICATIONS

M. W. Goddwin, et al., "Metal–Insulator Semiconductor Properties of Molecular–Beam Epitaxy Grown HgCdTe Heterostructures," *J. Vac. Sci. Technol.* vol. 8, No. 2, Mar./Apr. 1990, pp. 1226–1232.

T. N. Casselman, et al., "An Integrated Multispectral IR Detector Structure", pp. 141–142, 1991.

E. R. Blazejewski, et al., "Bias–Switchable Dual–Band HgCdTe IR Photodetector", Presented at the IRIS Detectors Specialty Meeting in Boulder, Colo., Aug. 1991.

E. R. Blazejewski, et al., "Bias–Switchable Dual–Band HgCdTe Infrared Photodetector," *J. Vac. Sci. Technol.* B 10(4), Jul./Aug. 1992, 1992 American Vacuum Society, pp. 1626–1632.

*Primary Examiner*—Olik Chaudhuri
*Assistant Examiner*—Ken Horton
*Attorney, Agent, or Firm*—Brian A. Carlson; James C. Kesterson; Richard L. Donaldson

[57] ABSTRACT

A metal interconnect fabrication process for hybrid solid state systems such as thermal imaging system (50). A plurality of vias (62) are formed in a focal plane array (60) between the thermal sensors (20) to expose a corresponding array of contact pads (84) on a silicon processor (80) bonded to the focal plane array (60). A metal film layer (30) is disposed on the focal plane array (60) to fill the vias (62). Photoresist material (32) is patterned on the metal layer (30) to correspond with the desired sensor signal flow path. With the photoresist material (32) still in place, the metal layer (30) is dry etched to produce the desired metal interconnect pattern by removing portions of the metal layer (30) unprotected by the photoresist material (32).

29 Claims, 5 Drawing Sheets

METHOD OF FORMING INFRARED DETECTOR BY HYDROGEN PLASMA ETCHING TO FORM REFRACTORY METAL INTERCONNECTS

TECHNICAL FIELD OF THE INVENTION

This invention relates in general to semiconductor devices and more particularly to an infrared detector and method.

BACKGROUND OF THE INVENTION

For several years hybrid solid state system such as infrared detectors have been successfully incorporated into integrated circuits for mass production and miniaturization. Typically, such infrared detectors are fabricated in N×M arrays of infrared detector elements or thermal sensors. Each element in the array may itself be fabricated from semiconductor materials such as alloys of mercury, cadmium, and tellurium ("HgCdTe") which are operable to generate electron-hole pairs when struck by infrared radiation. The particular wavelength from which each element generates electron-hole pairs may be tuned by adjusting the ratio of mercury to cadmium in the semiconductor material. Infrared detectors typically sense electromagnetic radiation having a wavelength, generally, between 0.5 and 15 $\mu$m corresponding to an energy level of 2 to 0.1 eV.

Common applications for thermal sensors include thermal (infrared) imaging devices such as night vision equipment or target acquisition and tracking systems. One such class of thermal imaging devices includes a focal plane array of infrared detector elements or thermal sensors coupled to an integrated circuit substrate or silicon processor with a plurality of vias extending between the focal plane array and the integrated circuit substrate. The thermal sensors define the respective picture elements (or pixels) of the resulting thermal image. Examples of such infrared detectors and associated vias or metal interconnects between thermal sensors in a focal plane array and a silicon processor are shown in U.S. Pat. No. 4,447,291 entitled *Methods for Via Formation in HgCdTe*, and U.S. Pat. No. 5,144,138 entitled *Infrared Detector and Method*. For some infrared detectors the metal interconnect pattern is formed by using metal lift off techniques with evaporated indium or indium/lead/indium metal films.

SUMMARY OF THE INVENTION

In accordance with the present invention, the disadvantages and problems associated with previous metal interconnect and via formation processes for fabrication of hybrid solid state systems have been substantially reduced or eliminated. The present invention allows fabricating a selected metal interconnect pattern to couple two or more substrates of a solid state system such as sensor signal flow paths between the focal plane array of an infrared detector and an associated silicon processor.

One aspect of the present invention includes depositioning a metal film layer followed by a photoresist layer at selected locations and a dry etch to form the desired metal interconnects for electrically coupling thermal sensors in a focal plane array with a silicon processor substrate. Forming the metal film layer before applying the photoresist reduces potential surface contamination and minimizes the number of electrical shorts from incomplete metal bonding.

An important technical advantage of the present invention includes using dry etching techniques to form the desired metal interconnects which improve the overall yield of the fabrication process. Also, the present invention allows using various metals and their alloys such as indium, lead, aluminum, titanium, tungsten or other refractory metals to form the desired metal interconnect pattern to provide a plurality of sensor signal flow paths from a focal plane array to a silicon processor substrate.

Another aspect of the present invention includes fabricating a metal interconnect pattern between a focal plane array having a plurality of HgCdTe thermal sensors and an associated silicon processor using dry etching techniques.

A further significant technical advantage of the present invention includes providing a positive image of the desired interconnect metal by forming vias in an array of HgCdTe thermal sensors, covering the thermal sensors and vias with a metal film layer and forming the desired metal interconnect pattern using dry etching techniques in accordance with the present invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 1b is a drawing in section with portions broken away taken along lines 1b—1b of FIG. 1a;

FIG. 2b is a drawing in section with portions broken away taken along lines 2b—2b of FIG. 2a;

FIG. 3b is a drawing in section with portions broken away taken along lines 3b—3b of FIG. 3a;

FIG. 4b is a drawing in section with portions broken away taken along lines 4b—4b of FIG. 4a;

DETAILED DESCRIPTION OF THE INVENTION

Figure 1A:
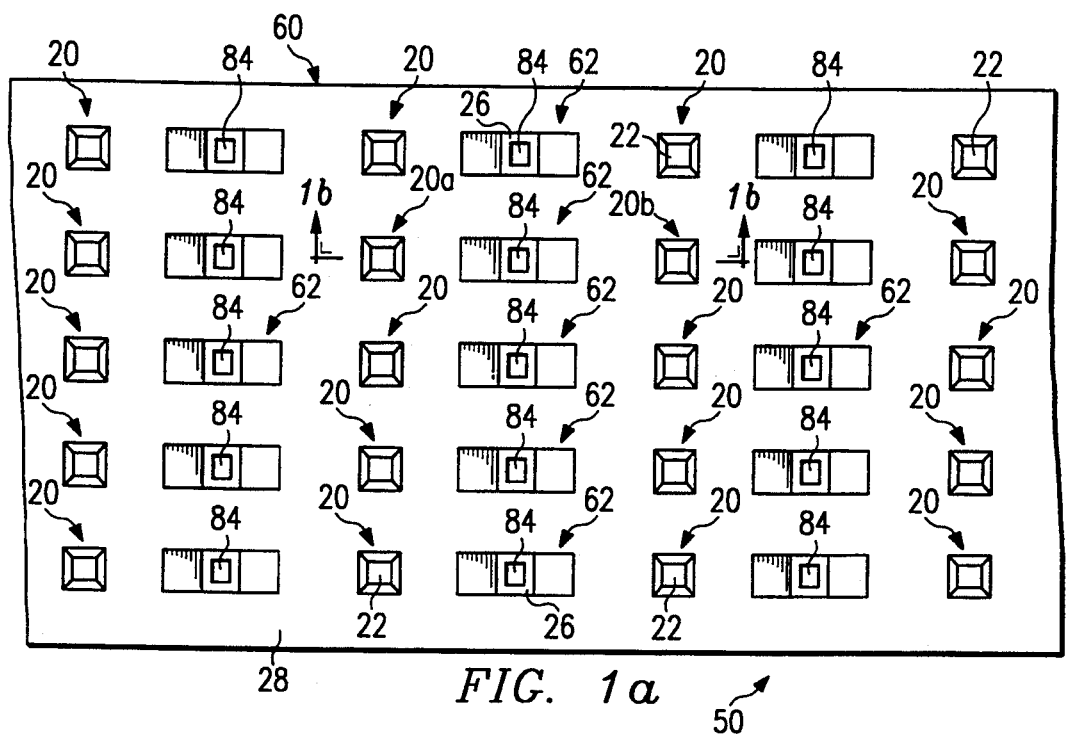
FIG. 1a is a schematic representation showing a plan view with portions broken away of an infrared detector and its associated focal plane array and silicon processor at an intermediate stage in the fabrication process.

The preferred embodiments of the present invention and its advantages are best understood by referring to FIGS. 1a through 8b of the drawings, like numerals being used for like and corresponding parts of the various drawings.

Infrared detectors or thermal imaging systems are typically based upon either the generation of a change in voltage due to a change in temperature resulting from incident infrared radiation striking a thermal sensor, or the generation of a change in voltage due to a photoelectron interaction within the material used to form the thermal sensor. This latter effect is sometimes called the internal photoelectric effect. Thermal sensors or infrared detector elements 20, which incorporate the present invention and described later in more detail, function based on the generation of electron-hole pairs resulting from the internal photoelectric effect.

The present invention may also be used to form metal interconnects associated with uncooled infrared detectors. Such detectors are typically formed with a plurality of thermal sensors (not shown) having ferroelectric elements which generate a change in voltage due to a change in temperature of the ferroelectric material resulting from incident infrared radiation. Such thermal sensors may be formed from barium strontium titanate or other suitable ferroelectric materials. As will be described later in more detail, the present invention allows fabricating a metal interconnect pattern for use in bump bonding ferroelectric thermal sensors with an integrated circuit substrate.

Infrared detector or thermal imaging system 50 may be manufactured from semiconductor materials which are structured as photodiodes and/or photocapacitors. U.S. Pat. No. 4,447,291 entitled *Methods for Via Formation in HgCdTe*, and U.S. Pat. No. 5,144,138 entitled *Infrared Detector and Method* provide information concerning infrared detectors fabricated from HgCdTe semiconductor materials and alloys which produce electron-hole pairs in response to incident infrared radiation. U.S. Pat. Nos. 4,447,291 and 5,144,138 are incorporated by reference for all purposes in this application.

FIGS. 1a through 4b are schematic representations of selected steps in the fabrication of infrared detector or thermal imaging system 50. Some of the principal components of thermal imaging system 50 include focal plane array 60 and integrated circuit substrate or silicon processor 80. As shown in FIGS. 1a, 2a, 3a and 4a, focal plane array 60 comprises a plurality of individual thermal sensors or infrared detector elements 20. Each infrared detector element 20 may be formed from several various types of material including semiconductor material such as HgCdTe which interacts with incident infrared radiation to produce electron-hole pairs. The various materials used to fabricate infrared detector elements 20 are typically deposited in a series of layers on a suitable substrate using lithographic techniques. For purposes of illustration and description, reference is made in FIGS. 1b, 2b, 3b and 4b to infrared detector elements 20a and 20b. However, for thermal imaging system 50, all infrared detector elements 20 are generally identical.

Each infrared detector element 20 is preferably disposed on planar surface 82 of silicon processor 80 adjacent to a corresponding contact pad 84. Via 62 is preferably provided between adjacent thermal sensors 20 to allow access to the associated contact pad 84. As will be explained later, via 62 shown in FIG. 1b between thermal sensors 20a and 20b allows forming a sensor signal flow path between storage gate 22 of thermal sensor 20b and the associated contact pad 84.

Silicon processor 80 is used to produce a thermal image based on incident infrared radiation striking infrared detector elements 20 in focal plane array 60. Infrared detector 50 will preferably include a plurality (N×M) of infrared detector elements 20 forming focal plane array 60 bonded to silicon processor 80. Each infrared detector element 20 corresponds to a picture element or pixel in the resulting infrared image produced by infrared detector 50.

Various types of silicon processors and/or integrated circuit substrates may be satisfactorily used in manufacturing infrared detector 50. U.S. Pat. No. 4,684,812 entitled *Switching Circuit for a Detector Array* provides information concerning one type of silicon processor satisfactory for use with focal plane array 60. U.S. Pat. No. 4,684,812 is incorporated by reference for all purposes in this application.

Figure 1B:
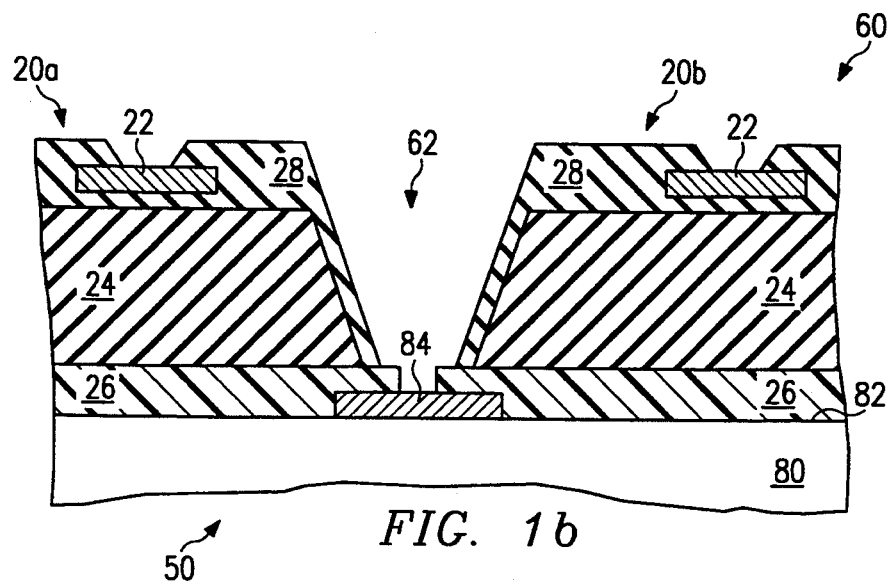

As shown in FIGS. 1a and 1b, focal plane array 60, includes a plurality of storage gates 22 which correspond respectively with infrared detector elements 20. Each storage gate 22 is preferable formed from metal such as nickel or tantalum which is relatively transparent to incident infrared radiation. Also, each storage gate 22 is preferably a thin strip of metal (often less than 100 angstroms thick) to further promote transparency with respect to incident infrared radiation. Each storage gate 22 and its associated infrared detector element 20 are separated from adjacent infrared detector elements 20 with no electrical contact therebetween.

As shown in FIGS. 1b, 2b, 3b, and 4b, each infrared detector element 20 comprises a plurality of layers of different materials which are disposed on planar surface 82 of silicon processor 80. Each infrared detector element 20 includes bar 24 of semiconductor material such as HgCdTe, which is sensitive to incident infrared radiation. In the chemical formula $Hg_{1-x}Cd_xTe$ for bars 24, the values of x may be varied depending upon the desired sensitivity of the resulting thermal sensor 20 to different wavelengths of incident infrared radiation. Each bar 24 may be mounted on surface 82 of silicon processor 80 using a suitable epoxy or other gluing compound. In FIGS. 1b, 2b, 3b, and 4b, the respective bars 24 are shown attached to silicon processor 80 with epoxy layer 26.

Figure 5:
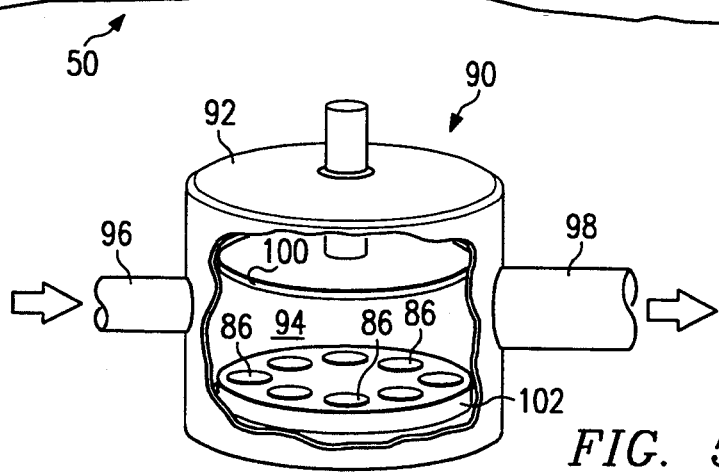
FIG. 5 is a schematic drawing in elevation and in section with portions broken away showing an RF chamber satisfactory for dry etching the infrared detector and focal plan array structure shown in FIGS. 3a and 3b.

Silicon Processor 80 typically represents one or more chips fabricated on the surface of a semi-conductor wafer such as semi-conductor wafers 86 shown in FIG. 5. A plurality of bars 24 may be mounted on one or more chips to form a plurality of infrared detectors 50 on each semi-conductor wafer 86. Vias 62 are formed between adjacent bars 24 corresponding with the location of each contact pad 84. U.S. Pat. 4,447,291 discloses one process for mounting bars 24 and forming vias 62.

An insulating layer 28 of zinc sulphide (ZnS) is preferably disposed on each bar 24 to protect semiconductor material HgCdTe and to position each storage gate 22 with respect to its associated bar 24. Each via 62 includes an opening through insulating layer 28 and epoxy layer 26 to allow access to the associated contact pad 84. Applying insulating layer 28 also assists with maintaining the cleanliness of the exposed surfaces of focal plane array 60. The resulting intermediate structure formed during fabrication of infrared detector 50 is shown in FIGS. 1a and 1b.

The following steps in the fabrication process are directed towards forming a metal interconnect pattern to provide a plurality of sensor signal flow paths from each storage gate 22 through its associated via 62 to the respective contact pad 84 on silicon processor 80. The resulting metal interconnects 34 may sometimes be referred to as "via interconnects," "metal connectors," or "metal strip conductors."

The next step in the process is to place metal film layer 30 across the surface of focal plane array 60. Metal film layer 30 may be formed using sputter deposition techniques or other techniques appropriate for the material selected for layer 30.

Prior fabrication processes often involved placing a layer of photoresist covering the focal plane array prior to forming the desired metal interconnect between each thermal sensor and its associated contact pad. Forming metal film layer 30 on focal plane array 60 prior to applying any photoresist material reduces potential surface contamination, increases the integrity of the metal bond with the respective storage gates 22 and contact pads 84. The number of electrical shorts resulting from incomplete bonding is substantially reduced by the use of metal film layer 30.

The present invention allows selecting various metals and metal alloys to form metal film layer 30. Examples of the metal film layers which may be satisfactorily used with the present invention include indium (In), indium-/lead/indium (In/Pb/In), aluminum (Al), or aluminum/-titanium-tungsten (Al/TiW). The present invention may also be used to form interconnect patterns from refractory metals such as titanium, tungsten, titanium-tungsten alloys, tantalum, molybdenum and alloys such as titanium silicon (Ti$_4$Si$_3$) and titanium nitride (TIN).

Figure 2A:
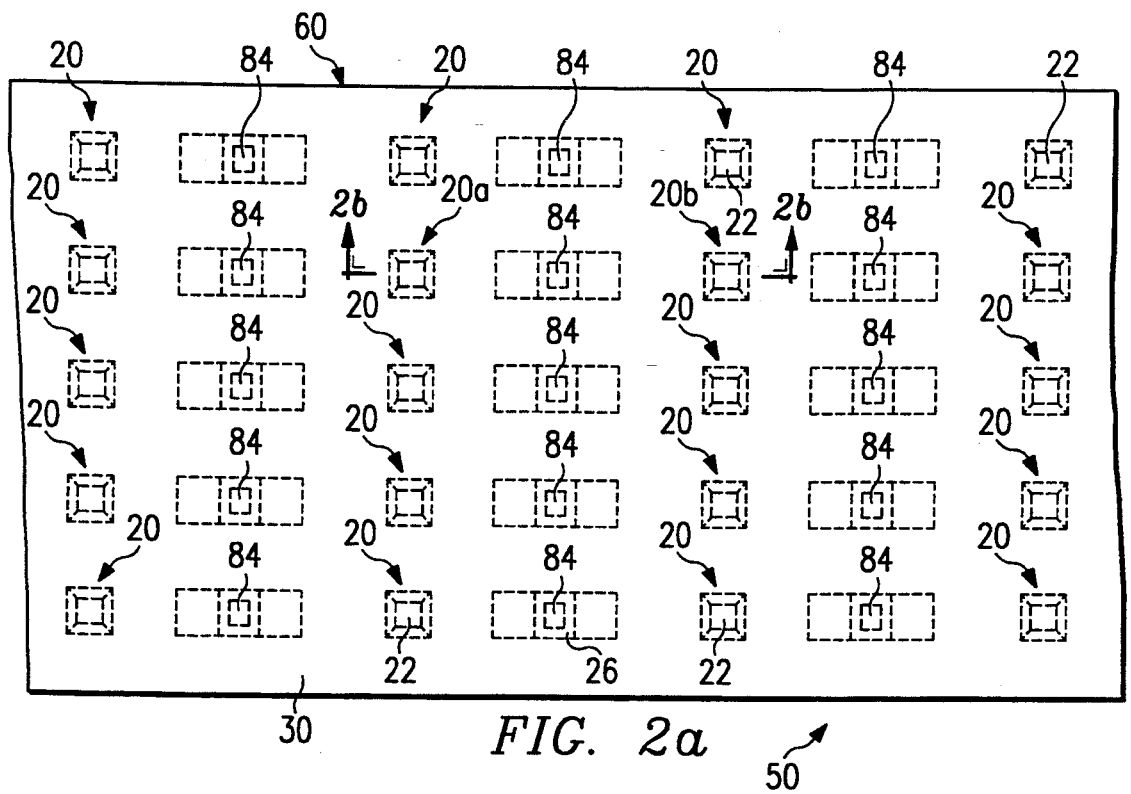
FIG. 2a is a schematic representation showing a plan view with portions broken away of the infrared detector of FIG. 1a after the focal plane array has been covered with a layer of interconnect metal.
Figure 2B:
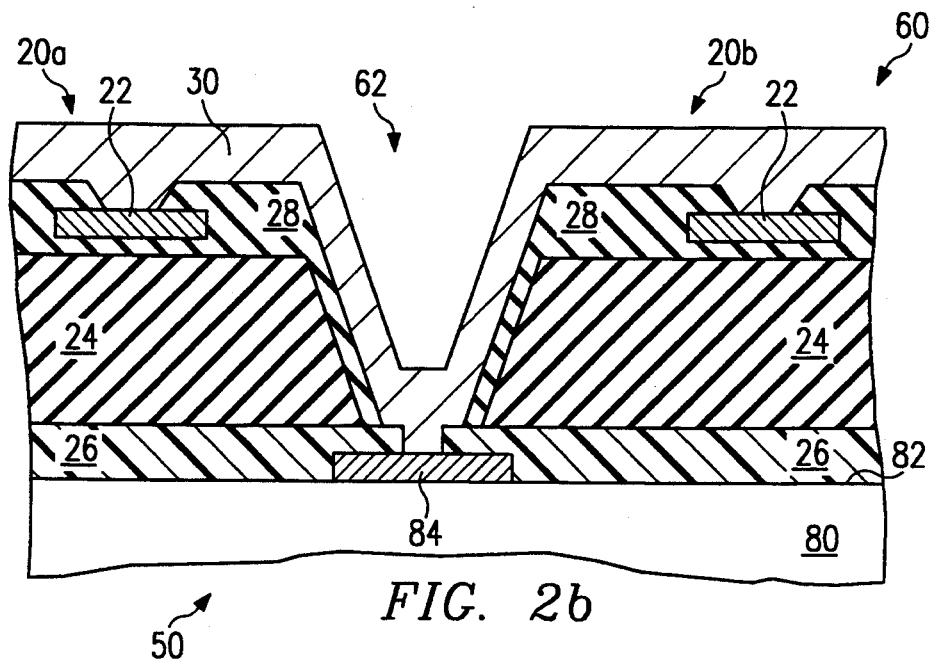

For one embodiment of the present invention film layer 30 is preferably formed from indium. This intermediate structure associated with the fabrication of infrared detector elements 20 is shown in FIGS. 2a and 2b.

Figure 3A:
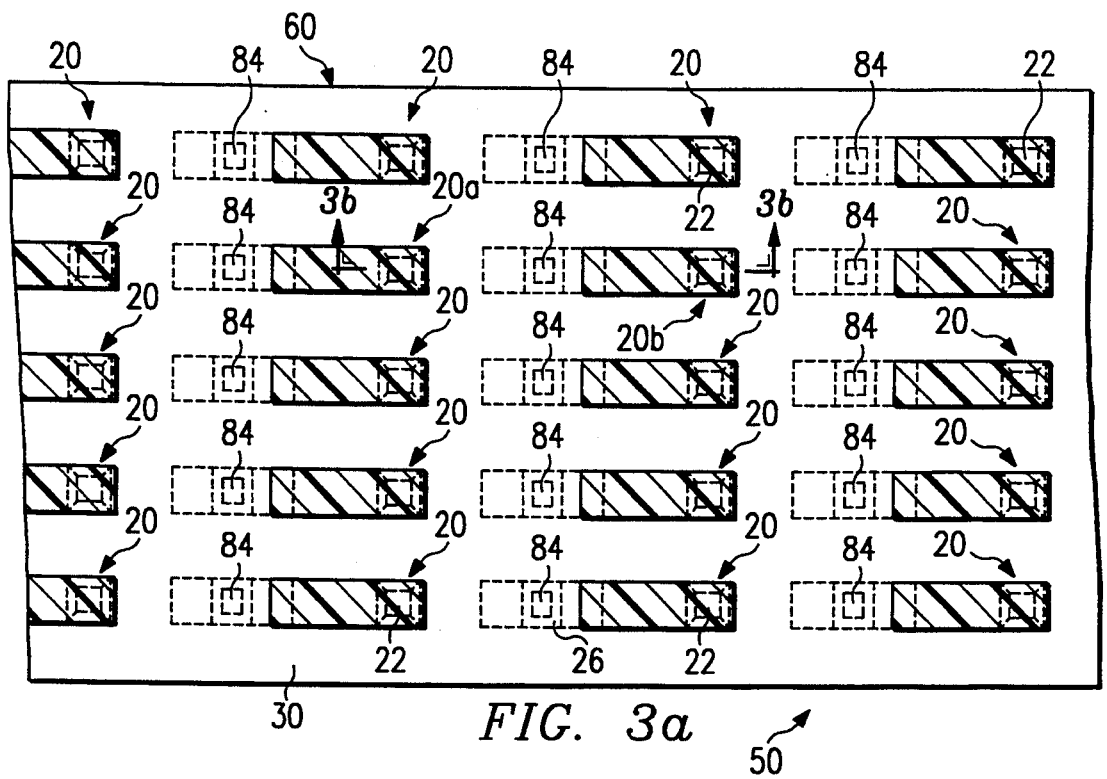
FIG. 3a is a schematic representation showing a plan view with portions broken away of the infrared detector of FIG. 2a after selected portions of the metal interconnect layer have been covered with a photoresist.
Figure 3B:
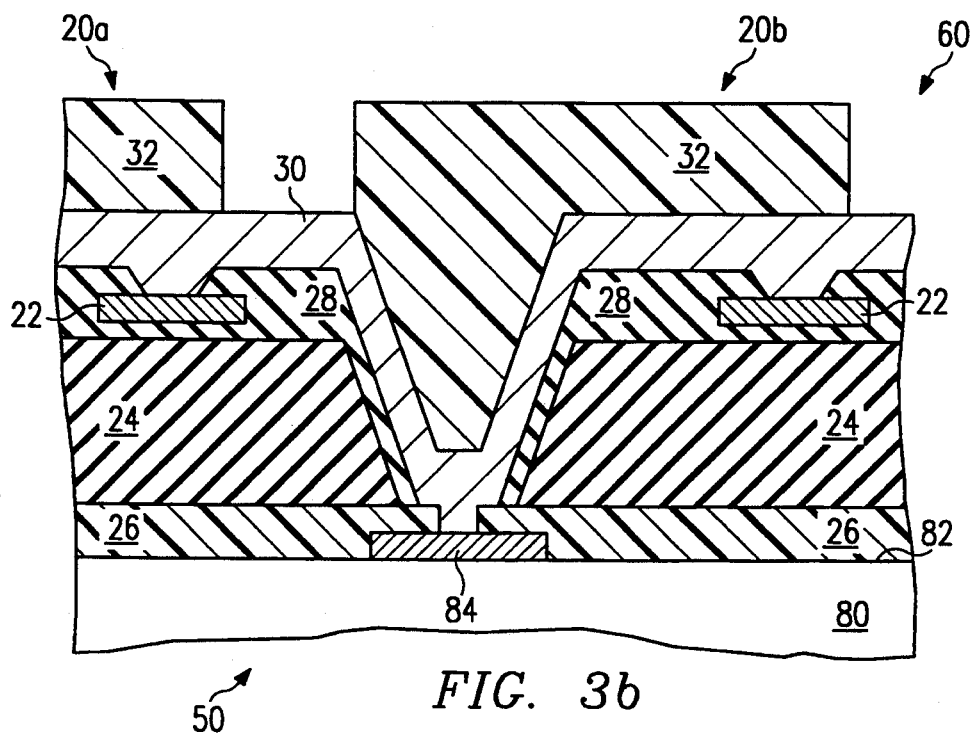
Figure 4A:
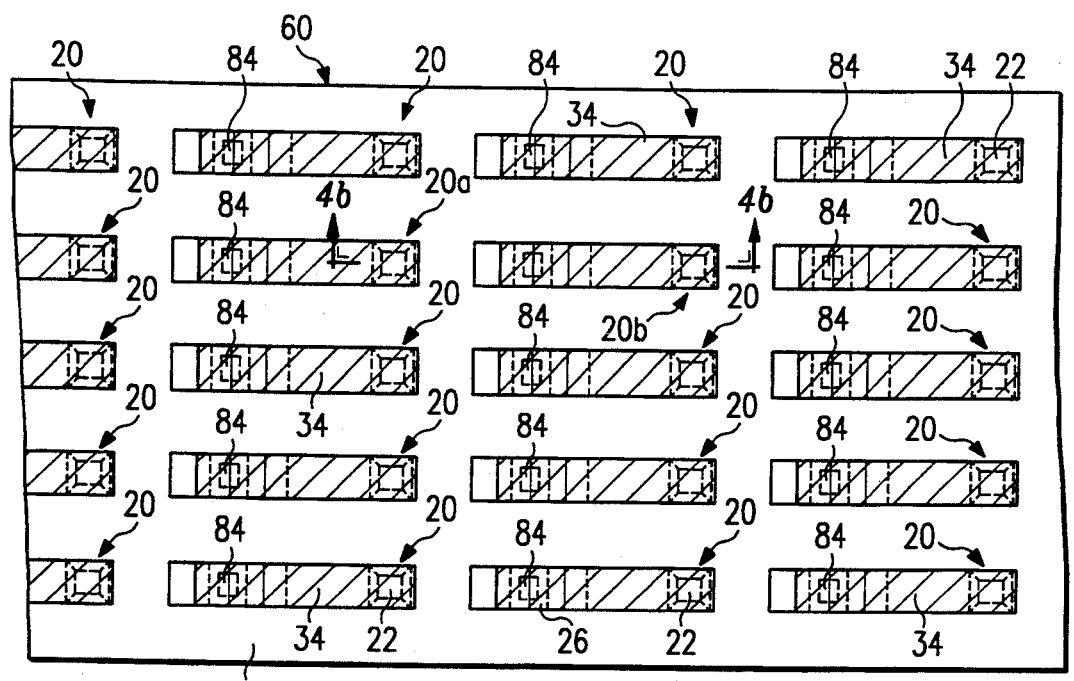
FIG. 4a is a schematic representation showing a plan view with portions broken away of the infrared detector of FIG. 3a after dry etching to form the desired metal interconnects or vias between thermal sensors in the focal plane array and contact pads on the silicon processor.
Figure 4B:
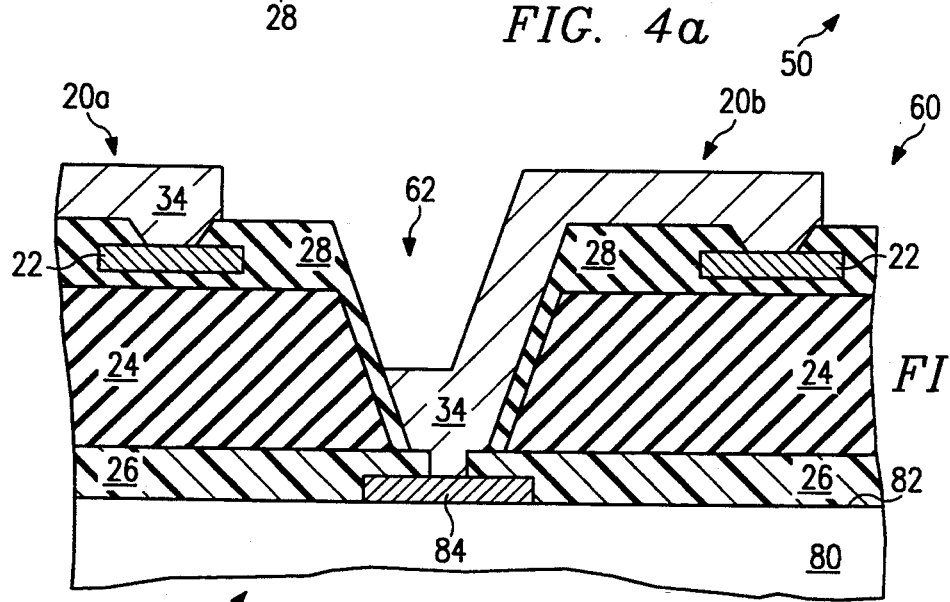

The next step in the process is to pattern a layer of photoresist material 32 at selected locations on metal film layer 30 as shown in FIGS. 3a and 3b. The position of each photoresist layer 32 is selected to correspond with the desired location of each sensor signal flow path or metal strip conductor 34 between its associated storage gate 22 and contact pad 84. The following step is dry etching to remove the portions of metal layer 30 which are not protected by photoresist layers 32. Following dry etch, photoresist layers 32 are stripped away to leave metal strip conductors 34 as shown in FIGS. 4a and 4b. Ashing or solvent stripping may be used as desired to remove photoresist layers 32. Metal strip conductors 34 are thus formed to extend from each storage gate 22 to the associated contact pad 84 and provide the desired sensor signal flow path.

The dry etching process used to form metal strip conductors 34 from metal film layer 30 may be conducted in various types of reactors. An RF discharge parallel plate reactor 90 satisfactory for use with the present invention is shown in FIG. 5. One of the advantages of dry etching is that the process may be performed at a relatively low temperature (less than 100° C.) as compared to other methods of forming metal connectors.

Reactor 90 includes housing 92 which contains chamber 94. Inlet 96 is provided to supply gas from a source (not shown) to chamber 94. Outlet 98 is provided to connect chamber 94 with a pump or other means (not shown) to form a vacuum within chamber 94. A pair of parallel electrodes 100 and 102 are disposed in chamber 94. RF power used to facilitate the dry etching process is supplied to upper electrode 100. Wafers 86 having a plurality of silicon processors 80 and associated infrared detectors 50 formed on the surface of each wafer 86 are preferably placed on lower or ground electrode 102.

Various types of etching gas may be satisfactorily used with the present invention. The selection of etching gas is dependent upon the metal or metal alloy used to form film layer 30. For one embodiment, a hydrogen plasma with either an argon or helium carrier has been particularly effective in the removal of indium metal by forming indium hydride. The hydrogen plasma etch may be performed at temperatures less than 100° C.

A hydrogen plasma etch may be satisfactorily used for other metals and metal alloys. The relatively low temperature (less than 100° C.) required for hydrogen plasma etching in accordance with the present invention is particularly beneficial for forming metal interconnect patterns from soft alloys and low melting temperature alloys. If desired, various methyl alkyl groups may be used as part of the dry etching process depending upon the type of metal or alloys used to form the film layer.

Semiconductor wafers 86 on ground electrode 102 are subjected to the selected etch plasma or gas which reacts with the unprotected portion of metal film layer 30. The resulting metal hydrides or organometallic products are removed from chamber 84 through outlet 98. The type of organometallic product formed by the etching process depends upon the constituents in the metal film layer 30 and the plasma etch gas.

For one embodiment of the present invention, metal film layer 30 is formed from indium. When hydrogen plasma enters chamber 94 through inlet 96, hydrogen radicals, formed with the aid of the RF energy, will combine with indium metal which has not been covered by photoresist layers 32 to form indium hydrides. By maintaining chamber 94 in a vacuum, the indium hydrides become volatile and are removed from the surface of focal plane array 60. Photoresist layers 32 protect the portions of metal film layer 30 which will become metal strip conducts 34 following the dry etching process. The result is a plurality of strips of indium 34 extending from each storage gate 22 to the corresponding pad 84. Metal layer 30 may be formed from indium and various indium alloys including lead indium.

Figure 6:
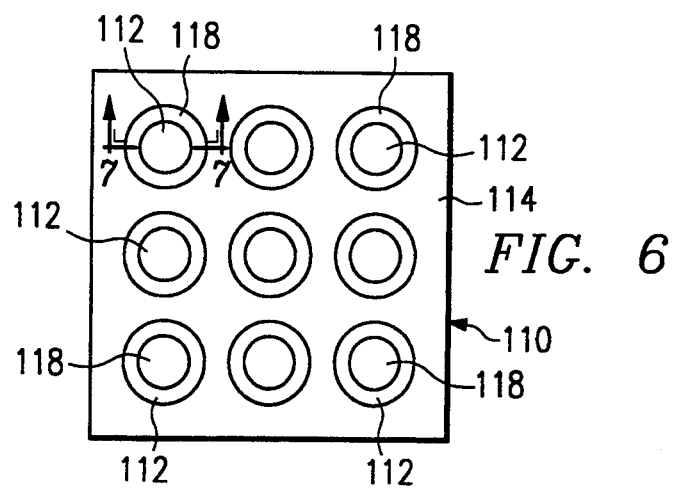
FIG. 6 is a schematic representation showing a plan view with portions broken away of a substrate having a metal interconnect pattern formed in accordance with the present invention.
Figure 7:
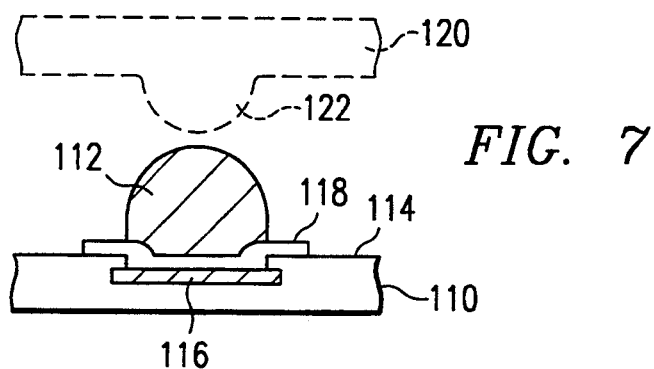
FIG. 7 is a schematic representation with portions broken away taken along lines 7—7 of FIG. 6.

The present invention may be used to form various types of metal interconnect patterns in addition to metal strip conductors 34 shown in FIG. 4a. For example, some hybrid solid state systems are formed by bump bonding component structures having corresponding bumps of indium metal. As shown in FIGS. 6 and 7, substrate 110 includes a plurality of indium bumps 112 formed on planar surface 114. Each indium bump 112 is preferably disposed on an associated contact pad 116 with barrier layer 118 therebetween. Barrier layer 118 may be formed from various metals and alloys such as nickel, chrome or titanium-tungsten. The material used to form barrier 118 is preferably selected to provide mechanical bonding and electrical contact between indium bump 112 and the associated contact pad 116 while at the same time minimizing potential corrosion between indium bump 112 and contact pad 116.

As shown by dotted lines in FIG. 7, substrate 120 with indium bump 122 may be bonded with corresponding indium bump 112 on substrate 110. Indium bumps 112 and 122 may be formed on their respective substrates 110 and 120 by forming a layer of indium metal on the surface of each substrate and dry etching the indium metal layer in accordance with the present invention.

Examples of thermal isolation structures and bump bonds are shown in U.S. Pat. No. 5,047,644 entitled *Polyamide Thermal Isolation Mesa for a Thermal Imaging System* to Meissner, et al. The fabrication techniques and the materials used in U.S. Pat. No. 5,047,644 may be used in fabricating either substrate 110 or 120. U.S. Pat. No. 5,047,644 is incorporated by reference for all purposes in this patent application.

Various types of thermal sensors and integrated circuit substrates may also be satisfactorily used with the present invention. U.S. Pat. No. 4,143,269 entitled *Ferroelectric Imaging System* provides information concerning infrared detectors fabricated from ferroelectric materials and a silicon switching matrix or integrated circuit substrate. Substrate 120 may be formed with a plurality of ferroelectric thermal sensors and substrate 110 may comprise an integrated circuit substrate as shown in U.S. Pat. No. 4,143,269. U.S. Pat. No. 4,143,269 is incorporated by reference for all purposes in this patent application.

Figure 8A:
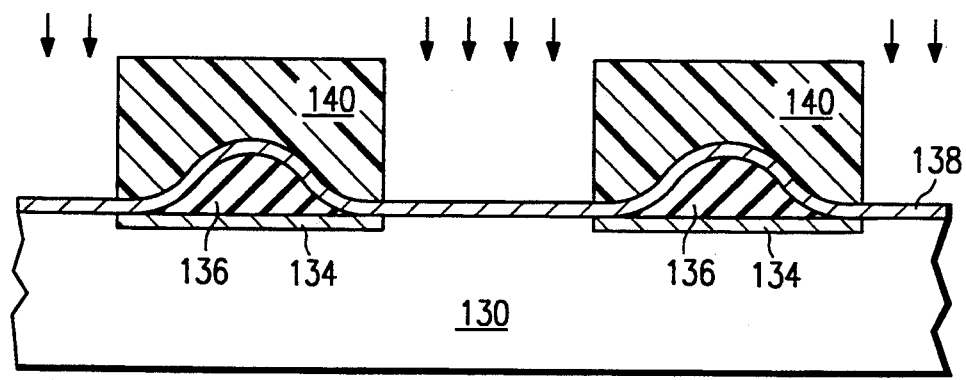
FIG. 8a is a schematic representation in section with portions broken away showing a substrate at an intermediate stage in the fabrication process covered with a layer of interconnect metal and selected portions of the metal interconnect layer covered with a photoresist.
Figure 8B:
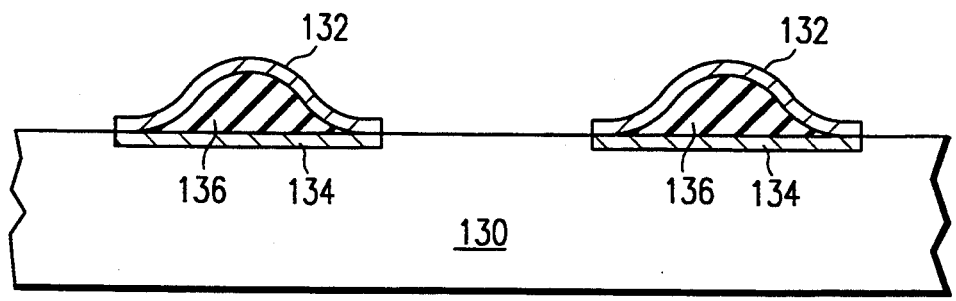
FIG. 8b is a schematic drawing in section with portions broken away showing the substrate of FIG. 8a with a metal interconnect pattern formed using dry etching techniques in accordance with the present invention.

FIGS. 8a and 8b are schematic representations showing the fabrication of metal interconnects 132 on the surface of integrated circuit substrate 130 using the present invention. Integrated circuit substrate 130 preferably includes a plurality of contact pads 134 with polyamide bumps 136 formed on the surface of each contact pad 134. The configuration of polyamide bumps 136 may be selected to correspond with the desired metal interconnect pattern.

As shown in FIG. 8a, a layer of interconnect metal 138 may be disposed over the surface of substrate 130 including polyamide bumps 136. Layers 140 of appropriate photoresist material are next placed on metal layer 138 to correspond with the desired metal interconnect pattern. Substrate 130 may then be placed in RF chamber 90 and dry etched in accordance with the present invention to form a plurality of metal interconnects 132 on the surface of substrate 130. For one embodiment of the present invention, metal film layer 138 is preferably formed from indium or alloys of indium. The resulting metal interconnects 132 may be used to bump bond a focal plane array with an integrated circuit substrate.

The present invention allows forming metal bumps, solder patterns, metal strips, or any other geometric configuration as desired from a layer of metal film. The requirements for forming a metal interconnect pattern in accordance with the present invention are positioning a photoresist on a metal film layer to produce the desired configuration and selecting a dry etch gas which will react with the unprotected portions of the metal film layer.

Although the present invention and its advantages have been described in detail, it should be understood that various changes, substitutions and alterations can be made therein without departing from the spirit and scope of the invention as defined by the appended claims.

What is claimed is:

1. A method of fabricating a metal interconnect pattern for use in electrically coupling two component structures in a hybrid solid state system comprising the steps of:
   forming a metal film layer wherein metal is a refractory metal or refractory metal alloy, on at least one of the component structures;
   placing a pattern of photoresist material on the metal layer with the photoresist pattern corresponding to the desired metal interconnect pattern;
   placing the component structure in an RF chamber; and
   dry etching the metal film layer with hydrogen plasma to form the desired metal interconnect pattern.

2. The method of claim 1 wherein the dry etching step applies the hydrogen plasma with a carrier gas of either argon or helium.

3. The method of claim 1 wherein said dry etching step further comprises:
   the hydrogen plasma forming a hydrogen radical in the RF chamber;
   a reaction between the hydrogen radical and the exposed portions of the metal layer to form a volatile metal hydride; and
   providing a vacuum in the RF chamber for removal of the metal hydride.

4. The method of claim 1, wherein the metal film comprises indium.

5. The method of claim 1 wherein the dry etching step is performed at a temperature less than 100° C.

6. A method of fabricating a thermal imaging system having a plurality of infrared detector elements disposed on a silicon processor with an array of contact pads comprising the steps of:
   mounting a plurality of HgCdTe semiconductor bars on the surface of the silicon processor to form each infrared detector element adjacent to its associated contact pads;
   forming a via between each infrared detector element to correspond with its associated contact pad;
   positioning a storage gate on the top of each semiconductor bar with an insulating layer therebetween;
   forming a layer of metal wherein the metal is a refractory metal or refractory metal alloy on the focal plane array to cover each storage gate and to fill each via;
   placing layers of photoresist material at selected locations on the layer of metal; and
   dry etching the metal layer with hydrogen plasma to form metal connectors extending from each storage gate to its associated contact pad.

7. The method of claim 6, wherein said dry etching step further comprises a methyl alkyl etch in an RF chamber.

8. The method of claim 6, wherein said dry etching step applies the hydrogen plasma with a carrier gas of either argon or helium in an RF chamber.

9. The method of claim 6 further comprising the preliminary step of forming a via between adjacent bars of semiconductor material to allow access to at least a portion of the associated contact pad.

10. A method of fabricating a metal interconnect pattern for use in electrically coupling a focal plane array having a plurality of thermal sensors with a silicon processor having an array of contact pads comprising the steps of:

forming a metal film layer wherein the metal is a refractory metal or refractory metal alloy on the focal plane array;

placing a pattern of photoresist material on the metal film layer with the photoresist pattern corresponding to the desired metal interconnect pattern;

placing the focal plane array in an RF chamber; and dry etching the metal film layer with hydrogen plasma to form the desired metal interconnect pattern.

11. The method of claim 10 wherein the dry etching step applies the hydrogen plasma with a carrier gas of either argon or helium.

12. The method of claim 10 wherein said dry etching step further comprises:

forming a hydrogen radical from the hydrogen plasma in the RF chamber;

a reaction between the hydrogen radical and the exposed portions of the metal layer to form a volatile metal hydride; and providing a vacuum in the RF chamber to remove the metal hydride.

13. The method of claim 10 further comprising the step of forming the film layer on the focal plane array from indium.

14. The method of claim 10 wherein the dry etching step is performed at a temperature less than 100° C.

15. The method of claim 10 further comprising the step of stripping the photoresist material from the metal interconnect pattern following completion of the dry etching step.

16. The method of claim 10 further comprising the steps of:

forming an array of indium bumps on the surface of the silicon processor for electrically coupling the focal plane array with the silicon processor;

forming the film layer on the focal plane array from indium; and placing the photoresist material on the indium film layer in a pattern corresponding to the indium bumps on the silicon processor.

17. A method of fabricating a metal interconnect pattern for use in electrically coupling a focal plane array having a plurality of thermal sensors with a silicon processor having an array of contact pads comprising the steps of:

forming a metal film layer wherein the metal is a refractory metal or refractory metal alloy on the silicon processor;

placing a pattern of photoresist material on the metal film layer with the photoresist pattern corresponding to the desired metal interconnect pattern;

placing the silicon processor in an RF chamber; and dry etching the metal film layer with hydrogen plasma to form the desired metal interconnect pattern.

18. The method of claim 17 wherein the dry etching step applies the hydrogen plasma with a carrier gas of either argon or helium.

19. The method of claim 17 wherein said dry etching step further comprises:

forming a hydrogen radical from the hydrogen plasma in the RF chamber;

a reaction between the hydrogen radical and the exposed portions of the metal layer to form a volatile metal hydride; and providing a vacuum in the RF chamber to remove the metal hydride.

20. The method of claim 17, wherein the metal film comprises indium.

21. The method of claim 17 wherein the dry etching step is performed at a temperature less than 100° C.

22. The method of claim 17 further comprising the step of stripping the photoresist material from the metal interconnect pattern following completion of the dry etching step.

23. The method of claim 17 further comprising the steps of:

forming an array of indium bumps on the surface of the focal plane array for electrically coupling the thermal sensors of the focal plane array with the silicon processor;

forming the film layer on the silicon processor from indium; and placing the photoresist material on the indium film layer in a pattern corresponding to the indium bumps on the focal plane array.

24. A method of fabricating a metal interconnect pattern for use in electrically coupling two component structures in a hybrid solid state system comprising the steps of:

forming a metal film layer comprised of a refractory metal or refractory metal alloy on at least one of the component structures;

placing a pattern of photoresist material on the refractory metal layer with the photoresist pattern corresponding to the desired metal interconnect pattern;

placing the component structure in an RF chamber;

dry etching the metal film layer with hydrogen plasma to form the desired metal interconnect pattern by forming a hydrogen radical in the RF chamber;

reacting the hydrogen radical and the exposed portions of the metal layer to form a volatile metal hydride; and providing a vacuum in the RF chamber for removal of the metal hydride.

25. The method of claim 24 further comprising the step of forming the metal film layer on the component structure from the group consisting of aluminum, indium, lead, titanium, tungsten, tantalum, molybdenum and alloys thereof.

26. The method of claim 1, wherein the metal film layer is selected from the group consisting of indium, lead, aluminum, titanium, tungsten, tantalum, molybdenum, and alloys thereof.

27. The method of claim 6, wherein the metal is selected from the group consisting of indium, lead, aluminum, titanium, tungsten, tantalum, molybdenum, and alloys thereof.

28. The method of claim 10, wherein the metal film layer is selected from the group consisting of indium, lead, aluminum, titanium, tungsten, tantalum, molybdenum, and alloys thereof.

29. The method of claim 17, wherein the metal film layer is selected from the group consisting of indium, lead, aluminum, titanium, tungsten, tantalum, molybdenum, and alloys thereof.

* * * * *